(12) United States Patent
Stilgenbauer et al.

(10) Patent No.: US 12,494,798 B2
(45) Date of Patent: Dec. 9, 2025

(54) DELTA-SIGMA MODULATOR WITH ANTI-WINDUP CIRCUIT

(71) Applicants: STMicroelectronics International N.V., Geneva (CH); Universita' Pavia, Pavia (IT); Politecnico Di Torino, Turin (IT)

(72) Inventors: Francesco Stilgenbauer, Rho (IT); Edoardo Botti, Vigevano (IT); Piero Malcovati, Pavia (IT); Paolo Stefano Crovetti, Turin (IT); Edoardo Bonizzoni, Pavia (IT); Matteo De Ferrari, Oleggio Castello (IT)

(73) Assignees: STMicroelectronics International N.V., Geneva (CH); Universita' Pavia, Pavia (IT); Politecnico Di Torino, Turin (IT)

( * ) Notice: Subject to any disclaimer, the term of this patent is extended or adjusted under 35 U.S.C. 154(b) by 317 days.

(21) Appl. No.: 18/127,848

(22) Filed: Mar. 29, 2023

(65) Prior Publication Data

US 2024/0333302 A1  Oct. 3, 2024

(51) Int. Cl.
  *H03M 7/32*  (2006.01)
  *H03M 3/00*  (2006.01)

(52) U.S. Cl.
  CPC .......... *H03M 3/422* (2013.01); *H03M 3/436* (2013.01)

(58) Field of Classification Search
  CPC .... H03M 3/422; H03M 3/436; H03M 7/3035; H03M 3/424; H03M 3/432; H03M 3/444
  USPC .................................................. 341/143, 155
  See application file for complete search history.

(56) References Cited

U.S. PATENT DOCUMENTS

| | | | | |
|---|---|---|---|---|
| 5,490,222 A | * | 2/1996 | Sugimoto | G06F 17/15 382/318 |
| 6,570,518 B2 | | 5/2003 | Riley et al. | |
| 6,954,161 B2 | | 10/2005 | Inukai et al. | |
| 7,439,893 B2 | | 10/2008 | Inukai et al. | |
| 7,471,223 B2 | * | 12/2008 | Lee | H03M 7/3008 341/131 |
| 7,936,293 B2 | | 5/2011 | Hamashita | |

(Continued)

FOREIGN PATENT DOCUMENTS

| CN | 207586782 U | 7/2018 |
|---|---|---|
| EP | 2781020 B1 | 12/2018 |

OTHER PUBLICATIONS

Das, Abhijit Kumar: "Continuous Time ΣΔ Modulator, Challenges & Possibilities," Circuits and Systems (MWSCAS), 2012 IEEE, 55TH International Midwest Symposium on, IEEE, pp. 378-381.

(Continued)

*Primary Examiner* — Jean B Jeanglaude
(74) *Attorney, Agent, or Firm* — Crowe & Dunlevy LLC

(57) ABSTRACT

A delta-sigma modulator includes a loop filter circuit having a first input that receives an input signal and a second input that receives a feedback signal. The loop filter circuit generates a filtered signal. A quantizer circuit quantizes the integrated signal to generate an output signal. An anti-windup circuit detects instances where the integrated signal is outside an input signal input of the quantizer circuit and in response thereto generates a dead zone signal having a magnitude and sign corresponding to a difference between the filtered signal and the input signal range. The feedback signal is a sum of the output signal and the dead zone signal.

19 Claims, 8 Drawing Sheets

(56) References Cited

U.S. PATENT DOCUMENTS

| | | | |
|---|---|---|---|
| 10,277,238 B2 | 4/2019 | Nagaraj | |
| 2007/0040718 A1* | 2/2007 | Lee | H03M 3/332 341/143 |
| 2009/0096649 A1* | 4/2009 | Ferri | H03M 3/412 341/143 |
| 2013/0207820 A1* | 8/2013 | Maurino | H03M 3/328 341/131 |
| 2014/0240153 A1 | 8/2014 | Das | |
| 2018/0096649 A1* | 4/2018 | Lee | G09G 3/3233 |

OTHER PUBLICATIONS

EPO Search Report and Written Opinion for counterpart EP Appl. No. 24163598.6, report dated Sep. 3, 2024, 10 pgs.

P. Malcovati, S. Brigati, F. Francesconi, F. Maloberti, P. Cusinato, and A. Baschirotto, "Behavioral modeling of switched capacitor sigmadelta modulators," in IEEE Transactions on Circuits and Systems I: Fundamental Theory and Applications, vol. 50, No. 3, pp. 352-364, Mar. 2003, doi: 10.1109/TCSI.2003.808892.

M. T. Kara and M. E. Rizkalla, "Single op-amp proportional-integral compensator with antiwindup," 1993 IEEE International Symposium on Circuits and Systems, 1993, pp. 2260-2263 vol. 4, doi: 10.1109/ISCAS.1993.394212.

Y. Eun, C. Gokcek, P. T. Kabamba, and S. M. Meerkov, "Selecting the level of actuator saturation for small performance degradation of linear designs," Proceedings of the 40th IEEE Conference on Decision and Control (Cat. No. 01CH37228), 2001, pp. 1769-1774 vol. 2, doi: 10.1109/CDC.2001.981160.

S. Kumar and R. Negi, "A comparative study of PID tuning methods using anti-windup controller," 2012 2nd International Conference on Power, Control and Embedded Systems, 2012, pp. 1-4, doi: 10.1109/ICPCES.2012.6508138.

B. Putzeys, "Simple, Ultralow Distortion Digital Pulse Width Modulator," Journal of the Audio Engineering Society, 2006.

J. Carletta, R. Veillette, F. Krach, and Z. Fang, "Determining appropriate precisions for signals in fixed-point IIR filters," Proceedings 2003. Design Automation Conference (IEEE Cat. No. 03CH37451), 2003, pp. 656-661, doi: 10.1145/775832.775998.

J. Dattorro, "The Implementation of Recursive Digital Filters for High-Fidelity Audio," J. Audio Eng. Soc., vol. 36, No. 11, pp. 851-878, (Nov. 1988.).

J. Vanderkooy and ST. P.. Lipshitz, "Dither in Digital Audio," J. Audio Eng. Soc., vol. 35, No. 12, pp. 966-975, (Dec. 1987.).

P. S. Crovetti, M. Usmonov, F. Musolino, and F. Gregoretti, "Limit-Cycle-Free Digitally Controlled DC-DC Converters Based on Dyadic Digital PWM," in IEEE Transactions on Power Electronics, vol. 35, No. 10, pp. 11155-11166, Oct. 2020, doi: 10.1109/TPEL.2020.2978696.

D. Cartasegna, P. Malcovati, L. Crespi, K. Lee, and A. Baschirotto, "Design of high-order class-D audio amplifiers," Proceedings of 2013 International Conference on IC Design & Technology (ICICDT), 2013, pp. 151-154, doi: 10.1109/ICICDT.2013.6563325.

Aguilar-Ibanez, Carlos, et al.: "PI-Type Controllers and $\Sigma$-$\Delta$ Modulation for Saturated DC-DC Buck Power Converters," Jan. 25, 2021, 12 pgs.

Jabbari, Professor Faryar, Chair, et al.: "Control Design for Systems with Bounded Actuators and Applications," University of California, Irvine, 2018, 215 pgs.

M. S. Reineh, A. F. Yeknami, M. Green, and F. Jabbari, "A High Dynamic Range $\Delta\Sigma$ Modulator using Anti-Windup Compensated Integrators," IFAC-PapersOnLine, vol. 53, No. 2, pp. 5550-5555, 2020.

M. C. Turner, G. Herrmann, and I. Postlethwaite, "Discretetime anti-windup: Part 1—Stability and performance," 2003 European Control Conference (ECC), 2003, pp. 473-478, doi: 10.23919/ECC.2003.7085000.

M. C. Turner and I. Postlethwaite, "A new perspective on static and low order anti-windup synthesis," International Journal of Control, vol. 77, No. 1, pp. 27-44, 2004, doi: 10.1080/00207170310001640116.

* cited by examiner

DELTA-SIGMA MODULATOR WITH ANTI-WINDUP CIRCUIT

TECHNICAL FIELD

Embodiments generally relate to a delta-sigma modulator and, in particular, to a delta-sigma modulator for use in analog-to-digital or digital-to-analog conversion.

BACKGROUND

FIG. 1 shows a time domain block diagram of a conventional delta-sigma modulator (DSM) circuit 10. The DSM circuit 10 has an input configured to receive an analog input signal A and an output configured to generate a digital output signal B. A difference amplifier 20 (or summation circuit) has a first (non-inverting) input that receives the input signal A and a second (inverting) input that receives an analog feedback signal C. The difference amplifier 20 outputs a difference signal D in response to a difference between the input signal A and the feedback signal C. The difference signal D is integrated by an integrator circuit 22 to generate an integration output signal E that varies over time as function of the sign and magnitude of the difference signal D. It will be noted that the loop filter circuit (amplifier 20 and integrator 22) may be a multi-stage circuit. A single-bit quantizer circuit 24 includes a single-bit analog-to-digital converter (ADC) circuit 25 that compares the signal E output from the loop filter (i.e., the filtered signal) to a reference to generate a corresponding single bit pulse of the digital output signal B (where the single bit has a first logic state if E≥reference and has a second logic state if E<reference). The single-bit quantizer circuit 24 further includes a single bit digital-to-analog converter (DAC) circuit 26 that converts the logic state of the digital output signal B to a corresponding analog voltage level for the analog feedback signal C.

It is possible to instead implement the delta-sigma modulator circuit 10 with a multi-bit quantization (for example, N bits) as shown by FIG. 2. This circuit implementation requires a quantizer circuit 24' with an N-bit quantization ADC circuit 25' and an N-bit DAC circuit 26'. The ADC circuit 25' of the quantizer circuit 24' generates a corresponding N-bit code word for the digital output signal B corresponding to the level of the filtered signal E. The DAC circuit 26' converts the N-bit code word of the digital output signal B to a corresponding analog voltage level for the feedback signal C.

To provide an analog-to-digital converter using the DSM circuit 10, the stream of bits for the digital output signal B may be decimated by a decimator circuit (not shown) to generate a multi-bit data word representative of the voltage level of the analog input signal A.

DSM circuits are adopted in a vast number of applications for their property of pushing the resolution beyond the quantizer limits. This is a consequence of inserting a non-linear element as last stage of the direct path in a closed-loop system: quantization noise spectra is kept low where the desired signal is present and increases outside the band of interest. This technique is extensively used in analog-to-digital converters (ADC) and digital-to-analog converters (DAC), but it is also possible to use this modulation if the input and output signals are of the same type, such as in the case of an analog-to-analog converter.

The DSM circuit shows an input signal-dependent stability. The largest input signal magnitude which avoids unstable modulator behavior is referred to as the maximum stable amplitude (MSA). This issue of input signal-dependent stability is present both in analog and digital DSM circuits. The cause of this phenomenon can be traced back to the phenomena of quantizer saturation and is a direct consequence of the limited number of available quantization levels. The filtered signal E input to the quantizer is loaded by the contribution of both the input signal A and the noise-shaped error. However, the signal range of the quantizer is often designed considering only the signal range of the filtered signal E, ignoring the noise shaping contribution. If the input to the quantizer (i.e., the signal E in FIGS. 1 and 2) is above a certain level, then a loop instability can emerge.

There are also numerous applications where a dithering contribution is added to the signal at the input of the quantizer. Dithering may, for example, be used to prevent audible artifacts, idle tones, and limit cycles. This dithering contribution, however, results in extra signal range requirements for the quantizer.

With reference once again to FIGS. 1 and 2, the filtered signal E output from the loop filter is the superposition of two components: the first is related to the input signal A and the second is the correction of the past errors caused by the loss of information in the signal transfer (signal E to output signal B) due to the quantization operation (i.e., the quantization error). When designing the DSM circuit, it is common to consider the maximum absolute value of the input signal A, the maximum absolute value of quantizer injected noise, and the loop filter transfer function to calculate the maximum absolute value of the signal E, in order to properly design the input signal range of the quantizer 24, 24'. However, this process is inconvenient in single-bit (two-level) quantization DSM circuits (see, FIG. 1, for example) because the contribution of the quantization noise increases with the order of the loop filter, so the full-scale is typically set according to the maximum possible signal range of the input signal A. Similarly, in multi-bit (multi-level) quantization DSM circuits (see, FIG. 2, for example), extra levels to contain the whole swing of the signal E are often not provided. This leads to instability in the loop filter integrators: when the input signal A is high enough to bring the quantizer 24, 24' into a saturation condition, the loop is broken and the integrators are lead into a divergence.

There is accordingly a need in the art to address the foregoing problem.

SUMMARY

In an embodiment, a delta-sigma modulator comprises: a loop filter circuit having a first input configured to receive an input signal, a second input configured to receive a feedback signal, and an output configured to generate a filtered signal; a clamping circuit having an input configured to receive the filtered signal and an output configured to generate a clamped filtered signal; a quantizer circuit configured to receive the clamped filtered signal and generate a quantizer output signal; a first summation circuit configured to generate a dead zone signal from a difference between the filtered signal and the clamped filtered signal; and a second summation circuit configured to generate the feedback signal from a sum of the quantizer output signal and the dead zone signal.

In an embodiment, a delta-sigma modulator comprises: a loop filter circuit having a first input configured to receive an input signal, a second input configured to receive a feedback signal, and an output configured to generate a filtered signal; a clamping circuit having an input configured to receive the filtered signal and an output configured to generate a clamped filtered signal; a quantizer circuit configured to receive the filtered signal and generate a quantizer output signal; a first summation circuit configured to generate a dead zone signal from a difference between the filtered signal and the clamped filtered signal; and a second summation circuit configured to generate the feedback signal from a sum of the quantizer output signal and the dead zone signal.

In an embodiment, a delta-sigma modulator comprises: a loop filter circuit having a first input configured to receive an input signal, a second input configured to receive a feedback signal, and an output configured to generate a filtered signal; a dead zone circuit having an input configured to receive the filtered signal and an output configured to generate a dead zone signal, wherein the dead zone signal is dependent on a difference between the filtered signal and maximum positive/negative signal limits; a quantizer circuit configured to receive the filtered signal and generate a quantizer output signal; and a summation circuit configured to generate the feedback signal from a sum of the quantizer output signal and the dead zone signal.

In an embodiment, a delta-sigma modulator comprises: a loop filter circuit having a first input configured to receive an input signal, a second input configured to receive a feedback signal, and an output configured to generate a filtered signal; a quantizer circuit coupled to the output of the loop filter circuit and configured to generate a quantizer output signal; an anti-windup circuit configured to detect that the filtered signal is outside an input signal range of the quantizer circuit and generate a dead zone signal having a magnitude and sign corresponding to a difference between the filtered signal and the input signal range; and a summation circuit having a first input configured to receive the quantizer output signal, a second input configured to receive the dead zone signal, and an output configured to generate the feedback signal.

BRIEF DESCRIPTION OF THE DRAWINGS

For a better understanding of the embodiments, reference will now be made by way of example only to the accompanying figures in which.

DETAILED DESCRIPTION

Figure 3:
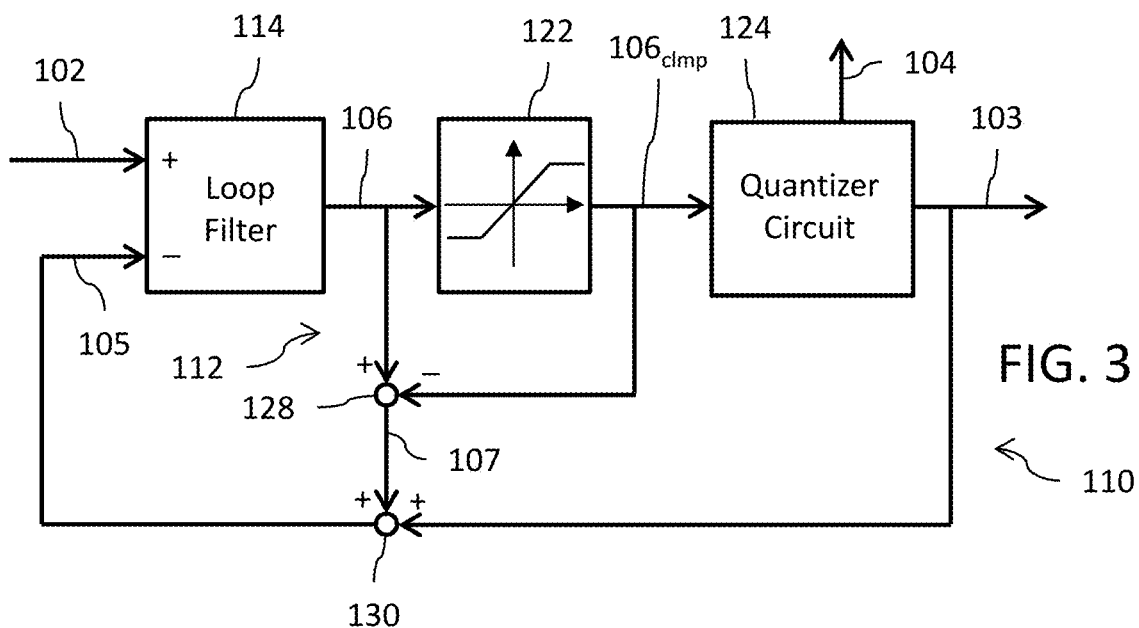
FIG. 3 is a block diagram of a delta-sigma modulator with an anti-windup circuit.

Reference is now made to FIG. 3 which shows a block diagram of a delta-sigma modulator (DSM) circuit 110. The DSM circuit 110 has an input configured to receive an input signal 102 and an output configured to generate a quantizer output signal 103 and an intermediate output signal 104. A loop filter circuit 114 has a first (non-inverting) input that receives the input signal 102 and a second (inverting) input that receives a feedback signal 105. A filtered signal 106 is output from the loop filter circuit 114. A clamping circuit 122 has an input configured to receive the filtered signal 106 output from the loop filter circuit 114 and an output configured to generate a clamped filtered signal $106_{clmp}$. The clamped filtered signal $106_{clmp}$ is processed by a quantizer circuit 124 to generate the quantizer output signal 103 and the intermediate output signal 104. A first summation circuit 128 determines a difference between the filtered signal 106 and the clamped filtered signal $106_{clmp}$ to generate a dead-zone signal 107 that is added by a second summation circuit 130 to the quantizer output signal 103 to generate the feedback signal 105. The clamping circuit 122, first summation circuit 128 and second summation circuit 130 form an anti-windup circuit 112.

Figure 4A:
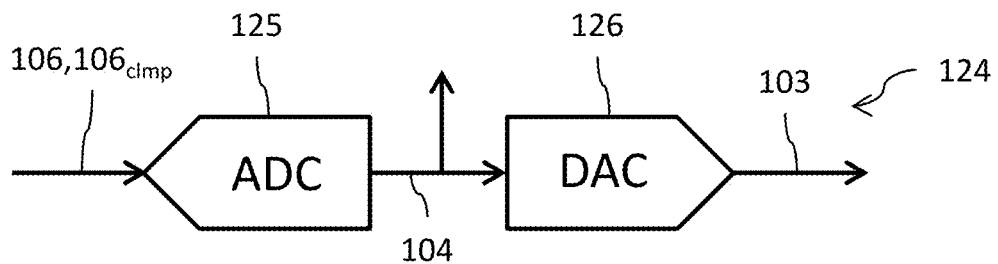
FIGS. 4A, 4B and 4C are block diagrams of embodiments for a quantizer circuit.

In an analog implementation of the DSM circuit 110, the quantizer circuit 124 may comprise, as an example, the series connection of an analog-to-digital converter (ADC) circuit 125 (single-bit or multi-bit) that generates the intermediate output signal 104 and a digital-to-analog converter (DAC) circuit 126 (correspondingly, single-bit or multi-bit) that converts the intermediate output signal 104 to generate the quantizer output signal 103 from which the feedback signal 105 is derived. See, FIG. 4A. The DAC circuit 126 of the quantizer circuit 124 may also implement a data weighted averaging (DWA) functionality (not explicitly shown, but known to those skilled in the art).

Figure 1:
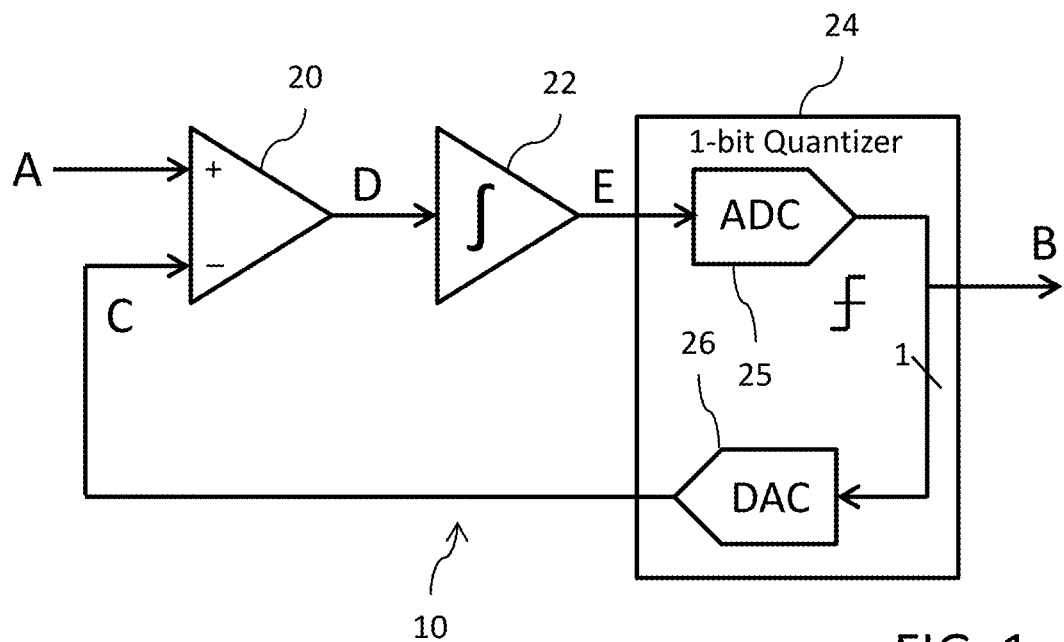
FIG. 1 is a block diagram of a conventional (for example, first order) delta-sigma modulator with single bit quantization.
Figure 2:
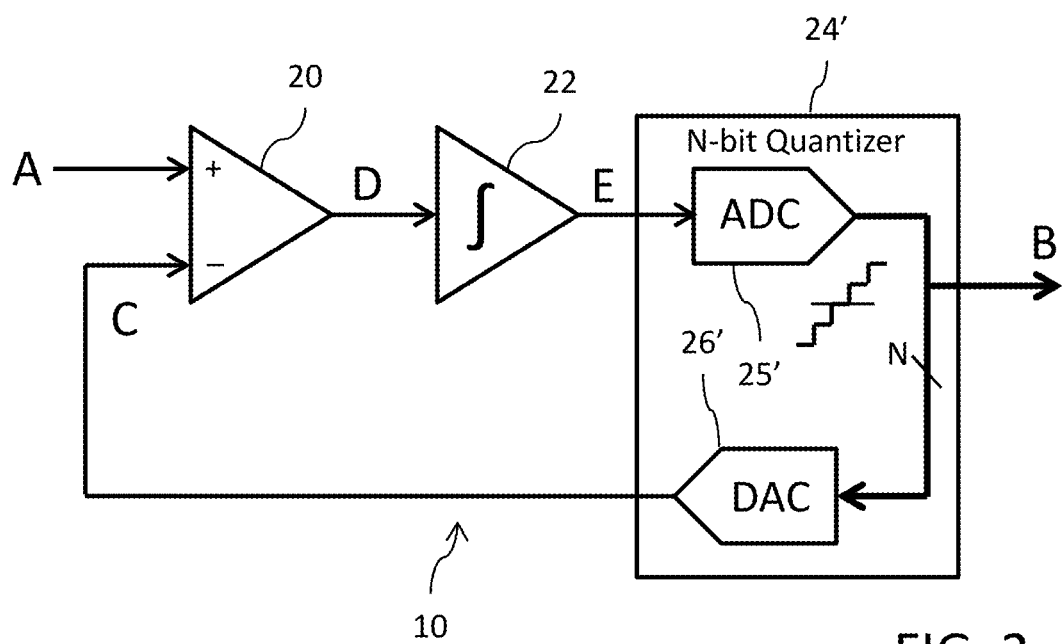
FIG. 2 is a block diagram of a conventional (for example, first order) delta-sigma modulator with multi-bit quantization.
Figure 4B:
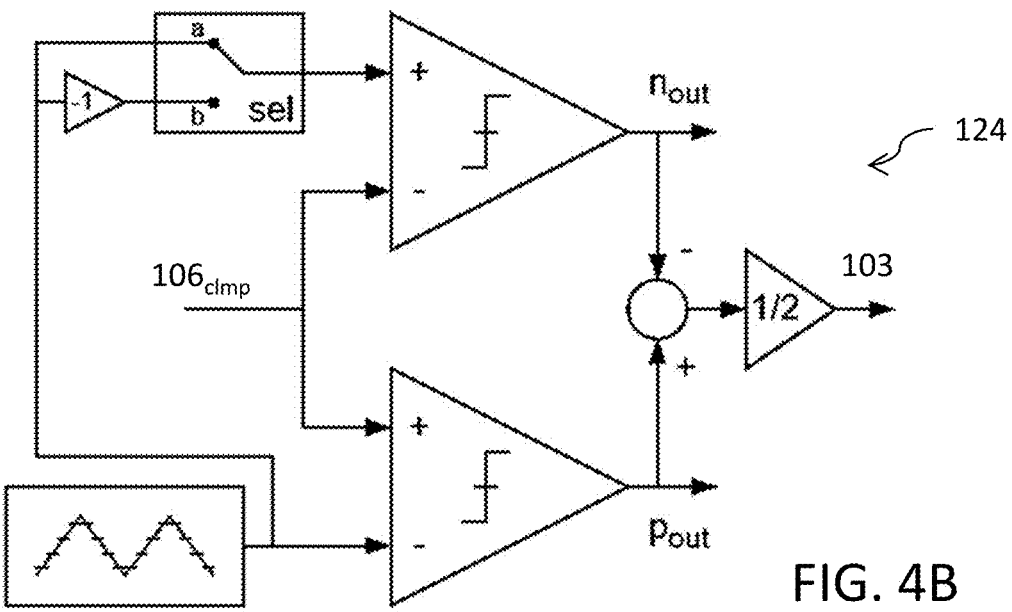

In a digital implementation of the DSM circuit 110, the quantizer circuit 124 may comprise, as an example, a pulse width modulation (PWM) quantizer. A circuit diagram for such a PWM quantizer is shown in FIG. 4B. See, also, for example, European Patent No. 2781020, FIG. 2 (incorporated herein by reference). The selector block sel is used to configure the PWM type: selection of the "a" case configures for a 2-level modulation, while selection of the "b" case configures for a 3-level modulation.

Figure 4C:
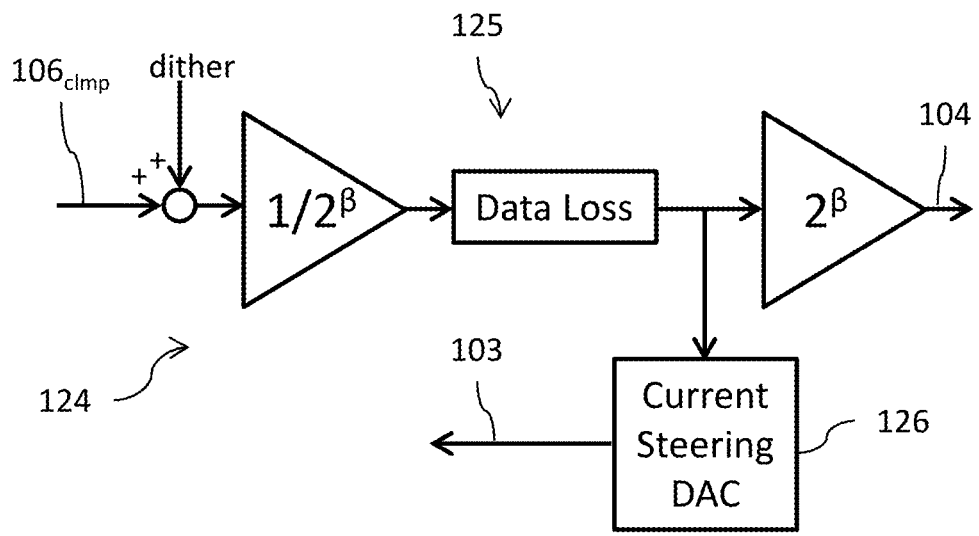

The quantizer circuit 124 of the DSM circuit 110 may, alternatively, comprise a circuit like that shown in FIG. 4C with an ADC circuit 125 and a current steering DAC circuit 126. See, for example, U.S. patent application Ser. No. 17/846,520, filed Jun. 22, 2022 (the disclosure of which is incorporated herein by reference).

The clamping circuit 122 of the anti-windup circuit 112 has a signal range (for example, maximum positive/negative signal limit) that are set equal to the positive/negative limits, respectively, of the input signal range of the quantizer circuit 124.

The dead-zone signal 107 is null in any case where the magnitude of the filtered signal 106 output from the loop filter circuit 114 is within the maximum positive/negative signal limits of the clamping circuit 122 (and thus, would not exceed positive/negative limits of the input signal range of the quantizer circuit 124). Otherwise, the dead-zone signal 107 is non-zero with a magnitude corresponding to the signal difference and a sign indicative of the polarity of the measured difference.

The effect of the application of a non-zero dead-zone signal 107 injected into the feedback path for generating the feedback signal 105 is to unload the integration functionality of the loop filter circuit 114 during instances where the quantizer circuit 124 would otherwise be saturated.

Figure 5A:
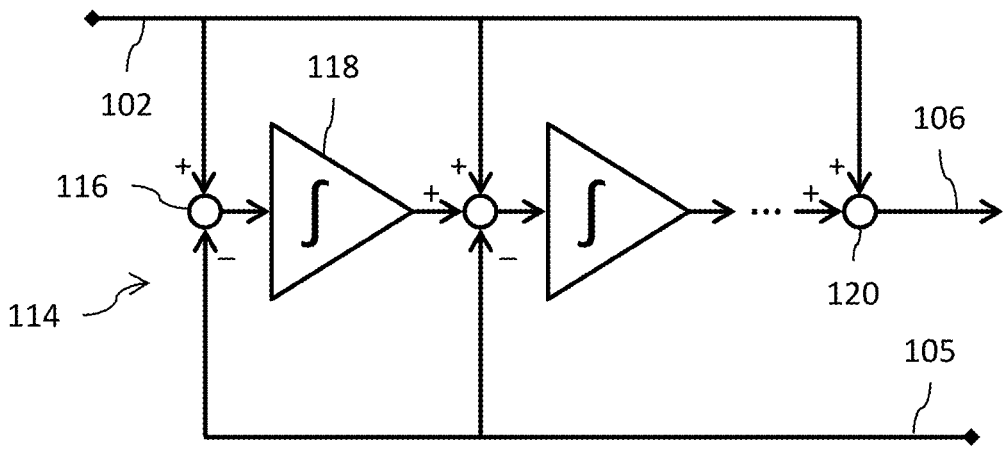
FIGS. 5A and 5B are block diagrams of embodiments for a loop filter circuit.

The loop filter circuit 114 may, for example, comprise a cascade of integrators with feedback (CIFB) type circuit as shown in FIG. 5A. See, also, for example, European Patent No. 2781020, FIG. 3 (incorporated herein by reference). Each stage of the cascade includes a summation circuit 116 coupled to an integration circuit 118. The summation circuit 116 of an initial cascade stage of the CIFB loop filter circuit 114 determines the difference between the input signal A and feedback signal C. The summation circuit 116 of the remaining cascade stage(s) of the CIFB loop filter circuit 114 determines the sum of the input signal A and output of the previous stage minus the feedback signal C. The CIFB loop filter circuit 114 further includes a summation circuit 120 that determines the sum of the input signal A (feed forward) and the output of the last cascade stage. It will be understood that each of the signals input to the summation circuits 116, 120 may, if desired, be scaled through use of an amplifier circuit (not shown). In particular, each summation before an integrator 118 may be weighted by the same coefficients that are used for noise shaping.

Alternative topologies for the loop filter circuit 114 are well known to those skilled in the art. Reference is made, for example, to Pavan, et al., Understanding Delta-Sigma Data Converters, Second Edition, 2017, pages 534-538 (incorporated here by reference). Each of the following types of loop filter circuit 114 could alternatively be selected by the circuit designer: CIFB—Cascade-of-integrators, feedback form; CIFF—Cascade-of-integrators, feedforward form; CRFB—Cascade-of-resonators, feedback form; CRFF—Cascade-of-resonators, feedforward form; CRFBD—Cascade-of-resonators, feedback form, delaying quantizer; CRFFD—Cascade-of-resonators, feedforward form, delaying quantizer; Stratos—A CIFF-like structure supporting NTF zeros on the unit circle (Jeff Gealow); and DSFB Double-sampled, feedback (Dan Senderowicz).

As a more general example of the loop filter circuit 114, the filter may include one or more of a proportional component, an integral component and a derivative component. Feed forward may also be used. Different coefficients may be utilized with respect to the input signal 102 and the feedback signal 105. The loop filter may have only a first order integrative and derivative part, but in general the order of the integrative part is n-th order (n≥1) and the derivative part is m-th order (m≥1).

Figure 5B:
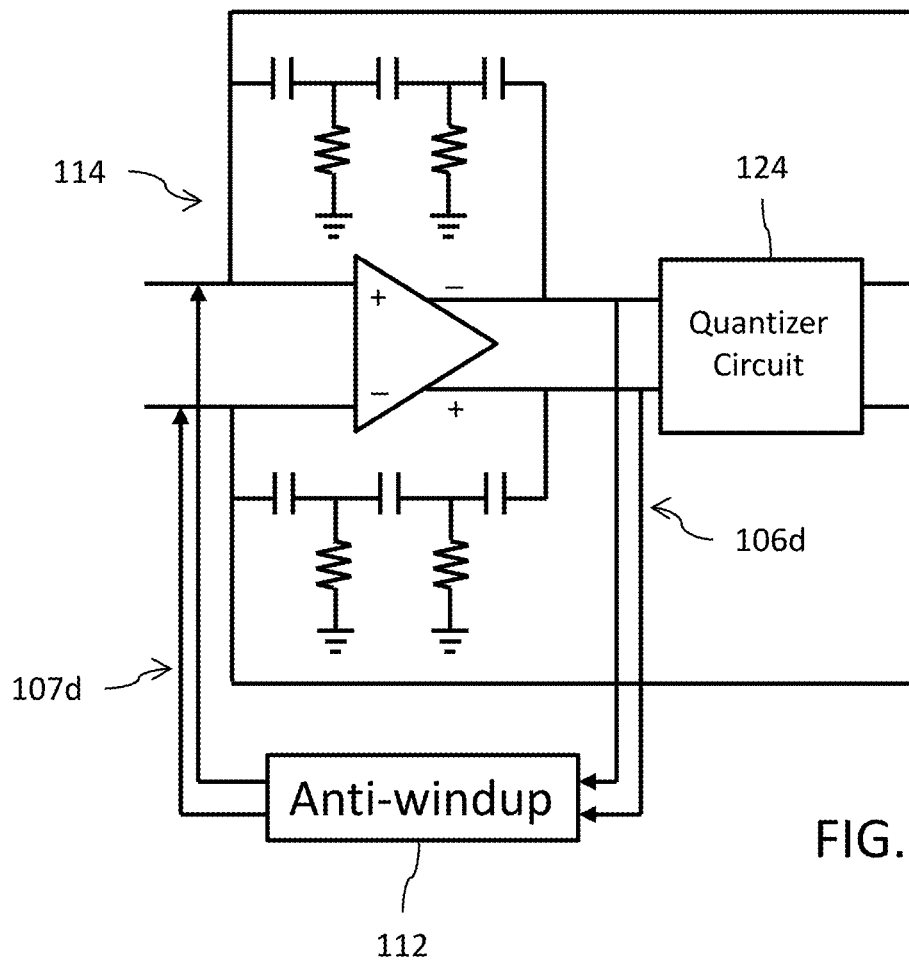
Figure 5C:
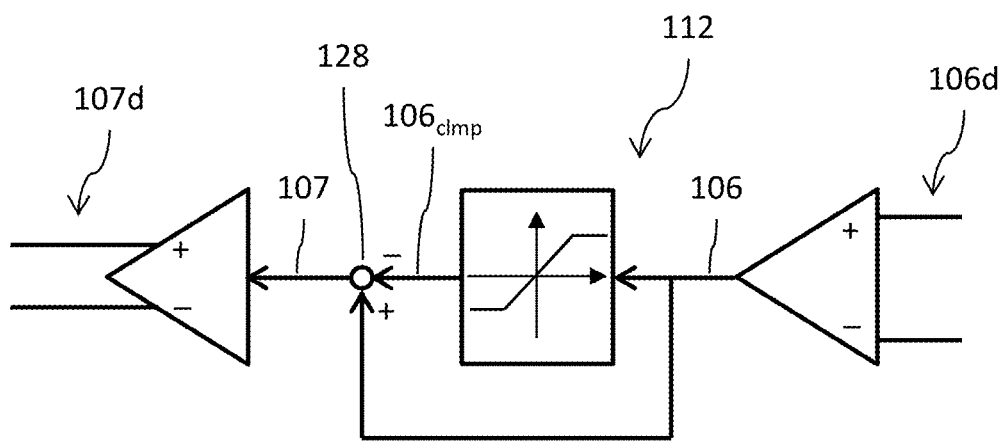
FIG. 5C shows an embodiment for the anti-windup circuit used in FIG. 5B.

Still further, the loop filter circuit 114 may, for example, comprise one or more fully differential analog integration stages as shown in FIG. 5B connected in series. The circuit utilizes a differential amplifier with a pi-network of capacitors and resistors for each of the differential feedback paths. In this configuration, the anti-windup circuit 112, shown in detail in FIG. 5C, is implemented to support fully differential signaling and includes: a differential (voltage) to single-ended (voltage) conversion circuit (converting differential signal 106*d* to single-ended signal 106) and a single-ended (voltage) to differential (voltage) conversion circuit (converting single-ended signal 107 to differential signal 107*d*). The clamping circuit 122 has an input configured to receive the single-ended conversion of the filtered signal 106 output from differential (voltage) to single-ended (voltage) conversion circuit and an output configured to generate a clamped filtered signal $106_{clmp}$. The summation circuit 128 determines a difference between the filtered signal 106 and the clamped filtered signal $106_{clmp}$ to generate the single-ended dead-zone signal 107 for input to the single-ended (voltage) to differential (voltage) conversion circuit.

The anti-windup functionality in FIG. 3 implements a back-calculation. In case the quantizer circuit saturation is not stimulated, which means the dead-zone signal equals 0, the system is the ideal version in which anti-windup is not present. The principle behind the back-calculation is to measure the amount of the saturation representing the dead-zone effect and feed it back in order to reduce the integral action in the loop filter. In the DSM circuit 110 of FIG. 3, a higher order integration is adopted by the CIFB loop filter circuit 114 for example, so the back calculation here is applied directly to the overall feedback signal 105. This architecture is highly convenient for the implementation because the feedback path can be reused to increase the feedback signal by the dead-zone effect itself.

Figure 6:
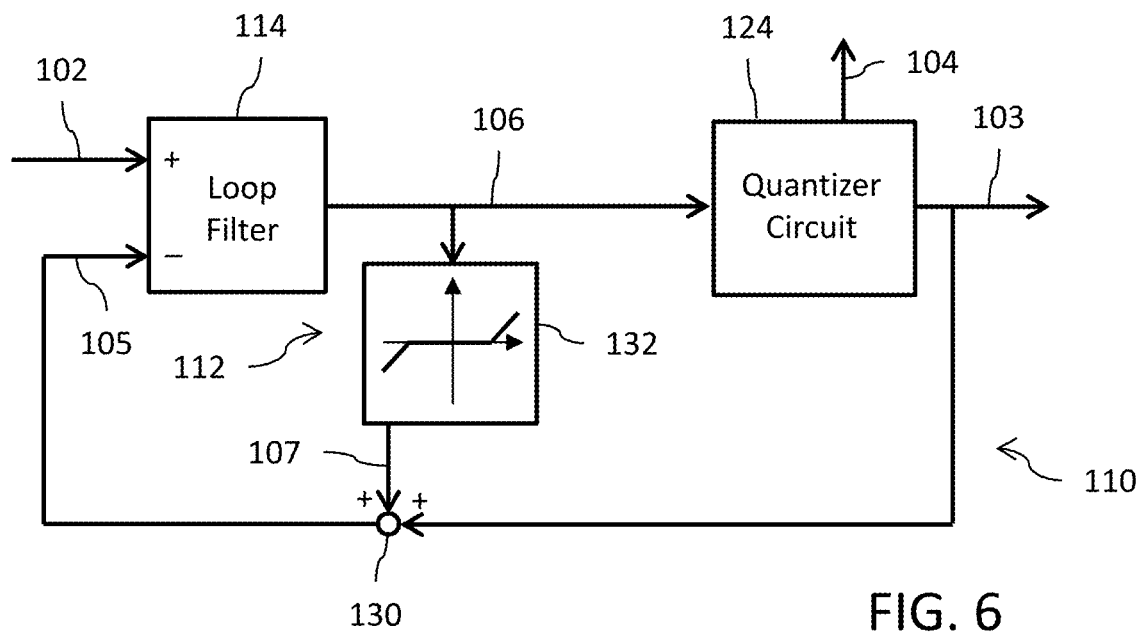
FIG. 6 is a block diagram of another embodiment for a delta-sigma modulator with an anti-windup circuit.

Reference is now made to FIG. 6 which shows a block diagram of another embodiment for the delta-sigma modulator 110 with the anti-windup circuit 112. Like references refer to like or same components, the description of which is not repeated. The circuit 112 of FIG. 6 differs from the circuit 112 of FIG. 3 in the use of a dead-zone detection circuit 132 in place of the clamping circuit 122. The dead-zone detection circuit 132 receives the filtered signal 106 and generates the dead-zone signal 107 that is added by a summation circuit 130 to the output signal 103 to generate the feedback signal 105. Note here that there is no clamping function performed prior to quantization. Rather the circuit 110 relies on the saturation function that is inherent to any bounded quantizer like that used for quantizer circuit 124. The dead-zone detection circuit 132 is configured such that the output dead-zone signal 107 is null if the filtered signal 106 is within the positive/negative limits of the inherent signal range of the quantizer circuit 124. Otherwise, the output dead-zone signal 107 is non-zero with a value (magnitude and sign) corresponding to the difference between the value of the filtered signal 106 and the value of inherent signal range limit.

Figure 7:
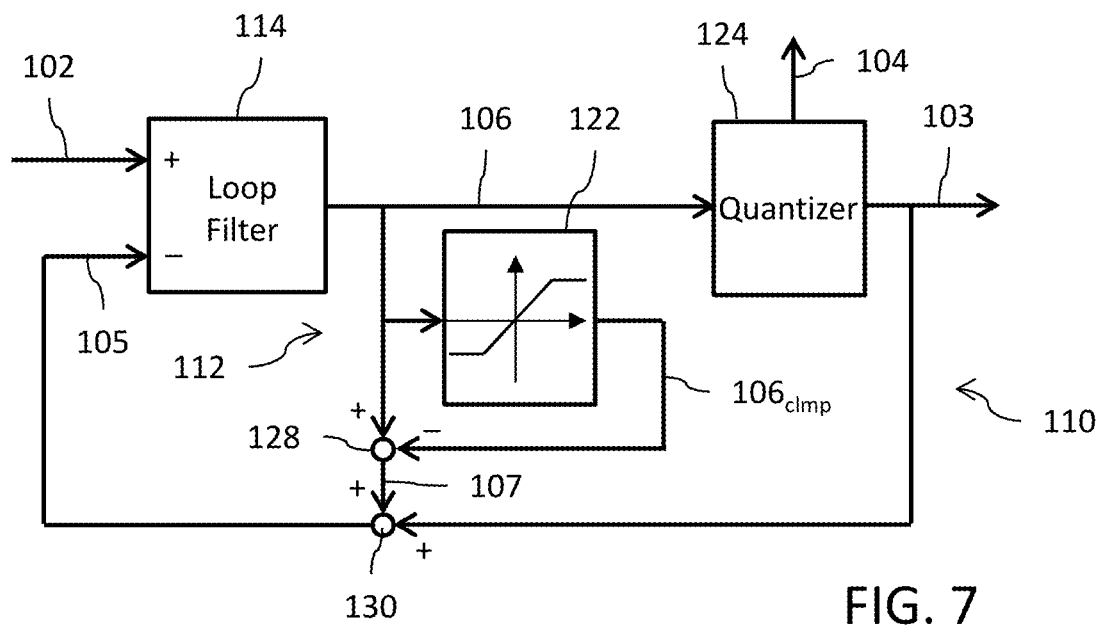
FIG. 7 is a block diagram of yet another embodiment for a delta-sigma modulator with an anti-windup circuit.

Reference is now made to FIG. 7 which shows a block diagram of yet another embodiment for the delta-sigma modulator 110 with the anti-windup circuit 112. Like references refer to like or same components, the description of which is not repeated. The circuit 112 of FIG. 7 differs from the circuit 112 of FIG. 3 in that the clamping circuit 122 is not connected in series between the output of the loop filter circuit 114 and the input of the quantizer circuit 124. In this implementation, the clamping circuit 122 does not provide a clamping action on the filtered signal 106 prior to quantization, and instead the circuit 110 relies on the saturation function that is inherent to any bounded quantizer like that used for quantizer circuit 124. The clamping circuit 122 has an input configured to receive the filtered signal 106 output from the loop filter circuit 114 and an output configured to generate a clamped signal $106_{clmp}$. The maximum positive/negative limits of the clamping circuit 122 are set equal to the positive/negative limits, respectively, of the input signal range of the quantizer circuit 124. A first summation circuit 128 of the anti-windup circuit 112 determines a difference between the filtered signal 106 and the clamped signal $106_{clmp}$ to generate a dead-zone signal 107 that is added by a second summation circuit 130 to the output signal 103 to generate the feedback signal 103. The dead-zone signal 107 is null in any case where the magnitude of the filtered signal 106 output from the loop filter circuit 114 is within the maximum positive/negative signal limits of the clamping circuit 122 (and thus, would not exceed positive/negative signal limits of the input signal range of the quantizer circuit 124). Otherwise, the dead-zone signal 107 is non-zero with a magnitude corresponding to the signal difference and a sign indicative of the polarity of the measured difference.

It will be understood that, in an alternative implementation, the maximum positive/negative signal limits of the circuits 122, 132 could instead be set to be less than the positive/negative signal limits of the input signal range of the quantizer circuit 124.

To test the benefit of including the anti-windup circuit 112 in a DSM circuit 110, a fourth order digital DSM circuit 110 (FIG. 3, 6 or 7) with a two-level PWM quantizer (FIG. 4B) was designed and simulated in MATLAB SIMULINK. In this simulation, the PWM quantizer of FIG. 4B is configured with the selector block sel making a connection to "a". The PWM comparison triangle is set to 2.3 MHz (for electromagnetic compatibility purposes). The system rate is set to about 36.9 MHz. The PWM frequency and system rate are in an integer ratio, leading to an 8-levels PWM triangle (3-equivalent bits). Additive triangular dither is present because it is crucial in numerical loops to break the first and second order correlation between the desired signal and the quantization noise. Poles-zeros are generated at the system sampling frequency and then shifted down with a pole-zero matching transformation at the PWM carrier frequency $$p_t = |p_o|^k e^{jk \, angle(p_o)}$$

where $p_o$ and $p_t$ are the generated and translated poles, respectively, and $k = f_{pwM}/f_{rate}$ is the scaling factor. The foregoing equation is applied also to the zeros, but an alternative approach of separated control on poles/zeros and magnitude/phase is possible. The saturation values, for example in the context of the FIG. 6 implementation with the dead-zone detection circuit 132, are given by the peak levels of the PWM comparing triangle.

In a PWM-like quantizer the swing (from negative to positive) is related to the comparing triangle peaks. As example refer to a single ended PWM. The quantizer input signal (with normalized input maximum from +/−1 compares with a fixed frequency triangle (with normalized peaks from +/−1). The comparator output is +1 when input is greater than the triangle and −1 when the input is less than the triangle. The comparator output duty cycle is proportional to the input signal level. When the input signal is −1 the duty cycle is 0%, when input signal is +1 the duty cycle is 100%. If the input signal is higher than +1 (or lower than −1) the comparison with the triangle signal becomes saturated and also the duty cycle is saturated (cannot be lower than 0% and higher than 100%).

Figure 8:
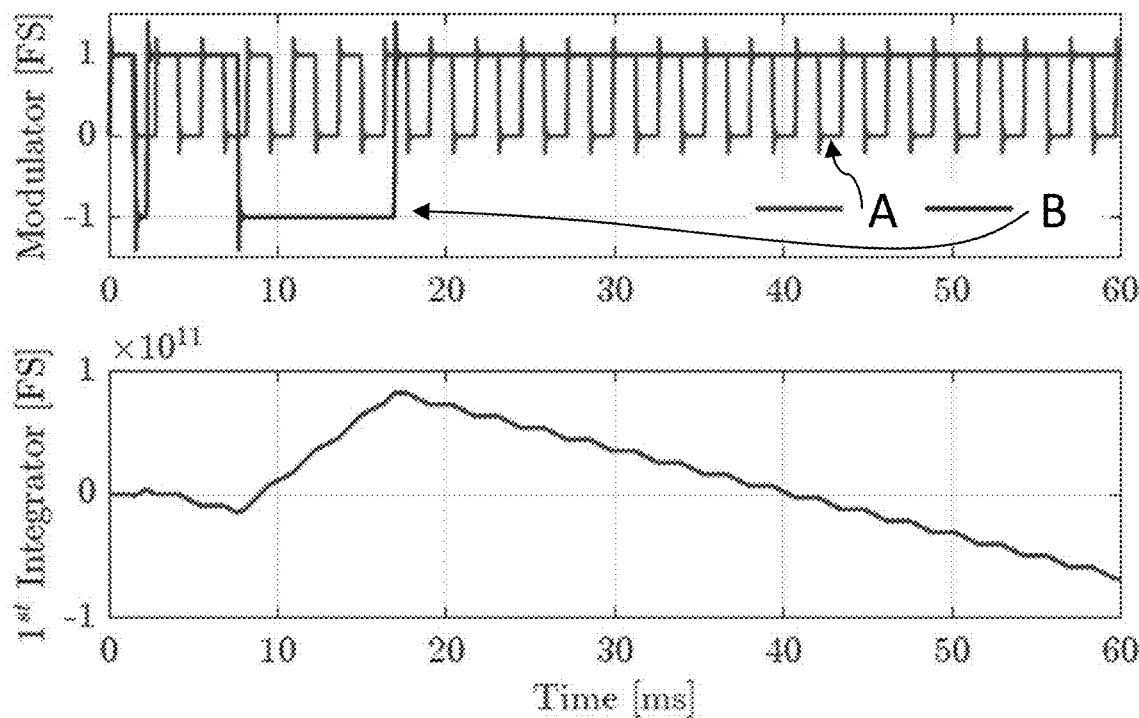
FIGS. 8-13 are graphs illustrating performance of a simulation of the delta-sigma modulator with the anti-windup circuit.
Figure 9:
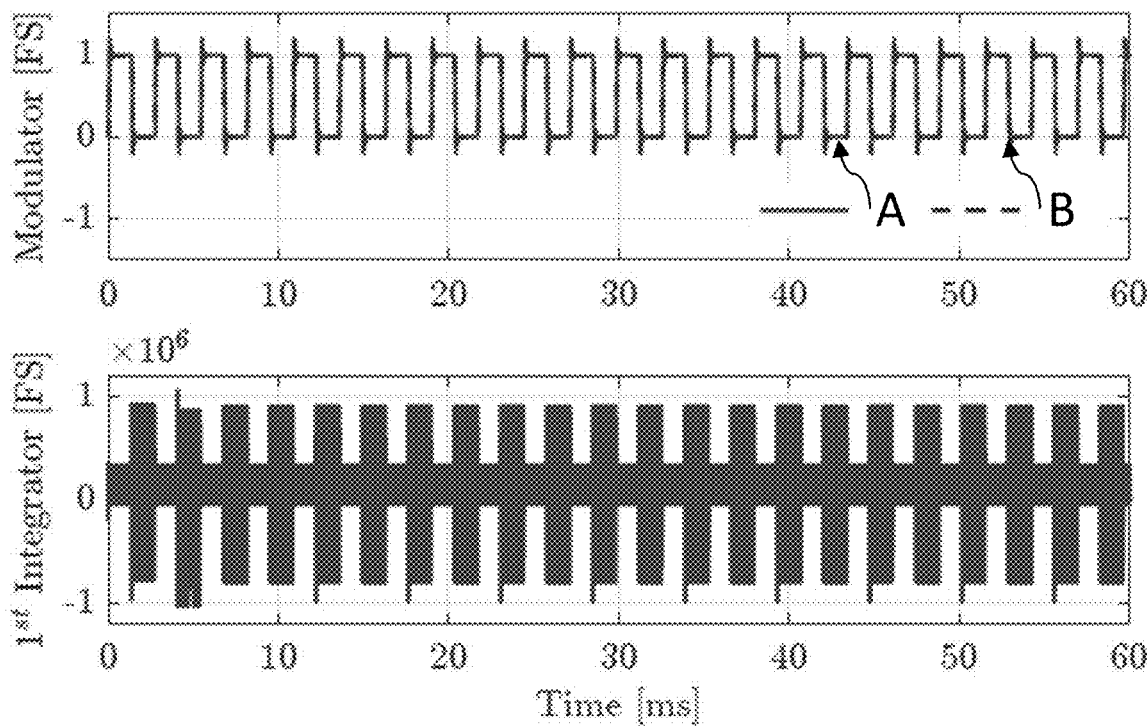

The benefit of the anti-windup can be shown with a 0 dBFS square wave response. The DSM circuit 110 input signal A is low-pass filtered (elliptic, 10-th order) in the same manner of the output in order to match the time-delay. FIG. 8 illustrates the circuit response where the dead-zone signal is unconnected: there is an instability in the time domain as the system integrators are diverging and the output response is not reproducing the input signal in the operating scenario. However, by activating the anti-windup compensation and applying the dead-zone signal, the DSM circuit 110 operation becomes stable as shown in FIG. 9 with the output response reproducing the input signal. In order to minimize the compression effect in input signal A to output signal B, the optionally applied dither has been disabled in connection of the results shown in both FIG. 8 and FIG. 9.

Figure 10:
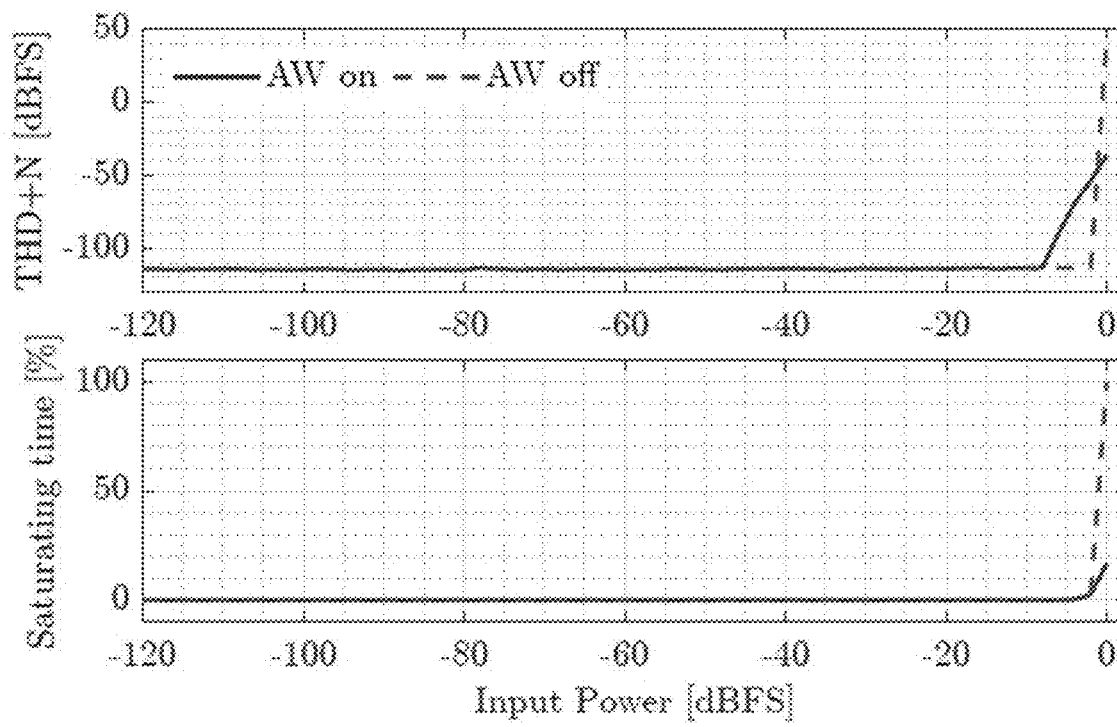

The total harmonic distortion plus noise (THD+N) vs. Input-power diagram is shown in FIG. 10, where operation of the circuit 110 with anti-windup activated (ON) is compared to operation of the circuit with anti-windup deactivated. In both cases, at around-8 dBFS saturation starts to occur, but the THD+N degrades only for the system with the anti-windup active. In this second case the degradation can be explained with the reduction of DSM order when the dead-zone signal rises. When the countermeasure is removed, the THD+N remains flat for higher levels of input signal, but the system becomes unstable at around 0 dBFS and the diagram is no longer of an significance.

Figure 11:
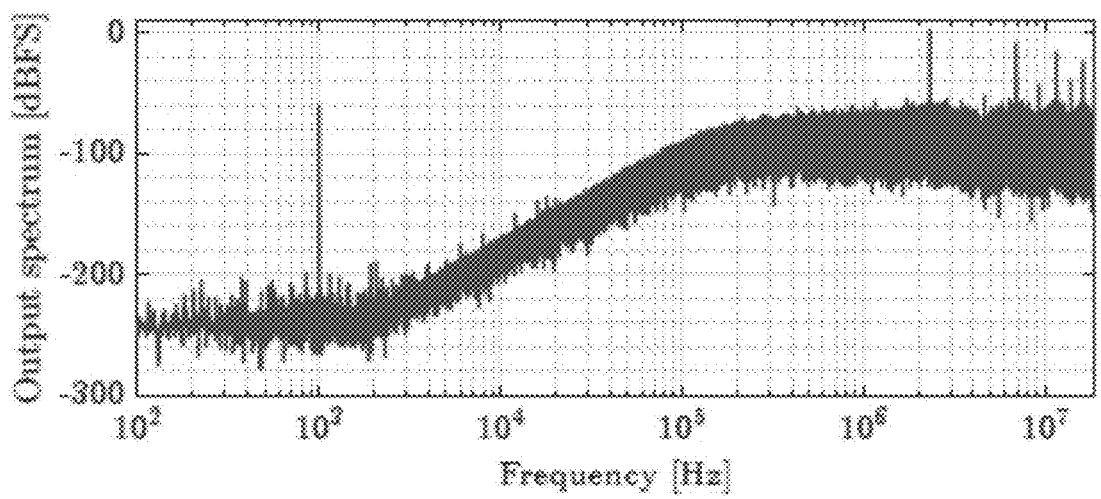
Figure 12:
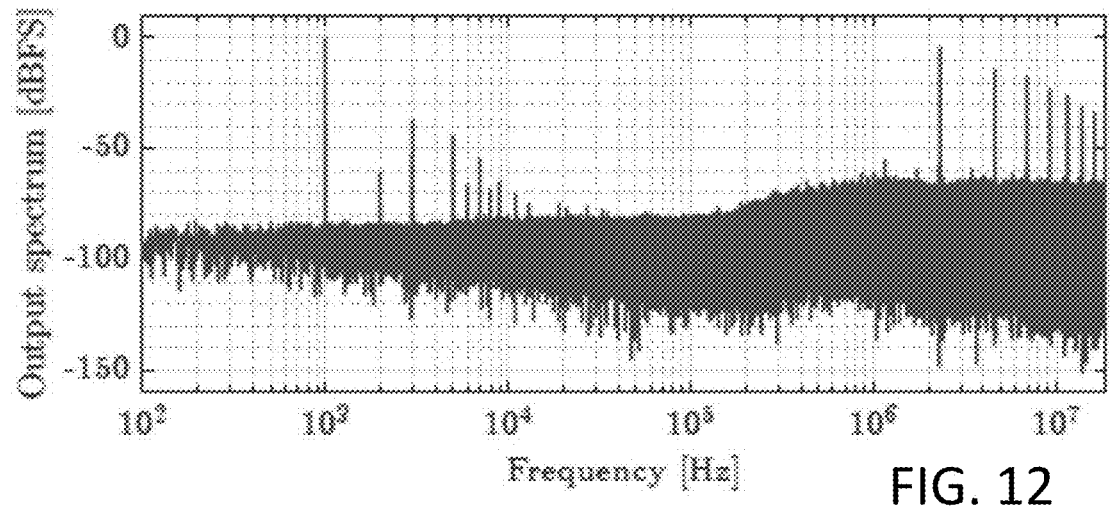

FIG. 11 shows the output power spectrum before the saturation intervention, while in FIG. 12 the anti-windup scheme is stressed by the input signal amplitude, and as a result the output equivalent number of bits degrades approaching to the quantizer levels itself.

Figure 13:
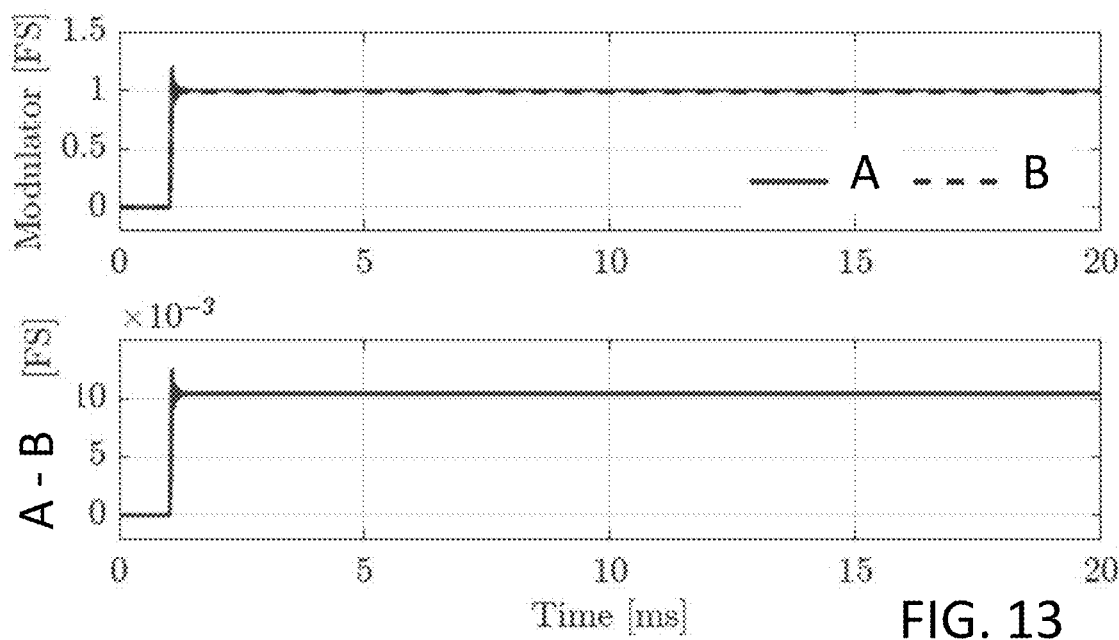

Since the DSM circuit 110 can be designed, just for example purposes, as base band, it is interesting to analyze a 0 dBFS step response. FIG. 13 reports the comparison, which shows the residual compression effect of the anti-windup in steady-state, minimized by the optional dither disabling.

The anti-windup back-calculation technique used in the context of a DSM circuit effectively pushes the MSA up to the input signal fullscale. This is achieved through the quantizer input dead-zone usage, summed directly onto the feedback signal and resulting in a global intervention on the integrators structure.

Intuitively, when the DSM circuit 110 is in deep saturation, the noise shaping would be practically useless. In this scenario the quantizer 124 is desired to be the only active element, which can be referred as 0-th order DSM degeneration. It is possible to reach gradually the transition from no saturation, in which the DSM is full order, to deep saturation, in which the DSM is degenerated by effectively progressively turning off the integrators of the loop filter circuit 114 using the saturation (dead-zone) information.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A delta-sigma modulator, comprising:
   a loop filter circuit having a first input configured to receive an input signal, a second input configured to receive a feedback signal, and an output configured to generate a filtered signal;
   a clamping circuit having an input configured to receive the filtered signal and an output configured to generate a clamped filtered signal;
   a quantizer circuit configured to receive the clamped filtered signal and generate a quantizer output signal;
   a first summation circuit configured to generate a dead zone signal from a difference between the filtered signal and the clamped filtered signal; and
   a second summation circuit configured to generate the feedback signal from a sum of the quantizer output signal and the dead zone signal.

2. The delta-sigma modulator of claim 1, wherein the loop filter circuit comprises a cascade of integrators and a summation circuit for each integrator, the summation circuit including a first input configured to receive the input signal, a second input configured to receive the feedback signal, and an output coupled to an input of the integrator.

3. The delta-sigma modulator of claim 2, wherein the cascade of integrators includes one or more of feed forward circuitry and feed back circuitry.

4. The delta-sigma modulator of claim 1, wherein the quantizer circuit comprises:
   an analog-to-digital converter configured to receive the clamped filtered signal and generate an intermediate signal; and
   a digital-to-analog converter configured to convert the intermediate signal to generate the quantizer output signal.

5. The delta-sigma modulator of claim 1, wherein the quantizer circuit comprises a digital pulse width modulation (PWM) quantizer.

6. The delta-sigma modulator of claim 1, wherein the clamping circuit has maximum positive/negative clamp limits less than or equal to positive/negative limits of an input signal range of the quantizer circuit.

7. A delta-sigma modulator, comprising:
   a loop filter circuit having a first input configured to receive an input signal, a second input configured to receive a feedback signal, and an output configured to generate a filtered signal;
   a clamping circuit having an input configured to receive the filtered signal and an output configured to generate a clamped filtered signal;
   a quantizer circuit configured to receive the filtered signal and generate a quantizer output signal;
   a first summation circuit configured to generate a dead zone signal from a difference between the filtered signal and the clamped filtered signal; and
   a second summation circuit configured to generate the feedback signal from a sum of the quantizer output signal and the dead zone signal.

8. The delta-sigma modulator of claim 7, wherein the loop filter circuit comprises a cascade of integrators and a summation circuit for each integrator, the summation circuit including a first input configured to receive the input signal, a second input configured to receive the feedback signal, and an output coupled to an input of the integrator.

9. The delta-sigma modulator of claim 8, wherein the cascade of integrators includes one or more of feed forward circuitry and feed back circuitry.

10. The delta-sigma modulator of claim 7, wherein the quantizer circuit comprises:
    an analog-to-digital converter configured to receive the clamped filtered signal and generate an intermediate signal; and
    a digital-to-analog converter configured to convert the intermediate signal to generate the quantizer output signal.

11. The delta-sigma modulator of claim 7, wherein the quantizer circuit comprises a digital pulse width modulation (PWM) quantizer.

12. The delta-sigma modulator of claim 7, wherein the clamping circuit has maximum positive/negative clamp limits less than or equal to positive/negative limits of an input signal range of the quantizer circuit.

13. A delta-sigma modulator, comprising:
    a loop filter circuit having a first input configured to receive an input signal, a second input configured to receive a feedback signal, and an output configured to generate a filtered signal;
    a quantizer circuit coupled to the output of the loop filter circuit and configured to generate a quantizer output signal;
    an anti-windup circuit configured to detect that the filtered signal is outside an input signal range of the quantizer circuit and generate a dead zone signal having a magnitude and sign corresponding to a difference between the filtered signal and the input signal range; and
    a summation circuit having a first input configured to receive the quantizer output signal, a second input configured to receive the dead zone signal, and an output configured to generate the feedback signal;
    wherein the anti-windup circuit comprises:
       a clamping circuit having maximum positive/negative clamp limits less than or equal to positive/negative limits of the input signal range of the quantizer circuit, said anti-windup circuit having an input configured to receive the filtered signal and an output configured to generate a clamped filtered signal for application to an input of the quantizer circuit; and
       a further summation circuit configured to generate the dead-zone signal from a difference between the filtered signal and the clamped filtered signal.

14. The delta-sigma modulator of claim 13, wherein the loop filter circuit comprises a cascade of integrators and a summation circuit for each integrator, the summation circuit including an input configured to receive the input signal, a further input configured to receive the feedback signal, and an output coupled to an input of the integrator, said cascade of integrators including one or more of feed forward circuitry and feed back circuitry.

15. The delta-sigma modulator of claim 13, wherein the quantizer circuit comprises a digital pulse width modulation (PWM) quantizer.

16. A delta-sigma modulator, comprising:
    a loop filter circuit having a first input configured to receive an input signal, a second input configured to receive a feedback signal, and an output configured to generate a filtered signal;
    a quantizer circuit coupled to the output of the loop filter circuit and configured to generate a quantizer output signal;
    an anti-windup circuit configured to detect that the filtered signal is outside an input signal range of the quantizer circuit and generate a dead zone signal having a magnitude and sign corresponding to a difference between the filtered signal and the input signal range; and
    a summation circuit having a first input configured to receive the quantizer output signal, a second input configured to receive the dead zone signal, and an output configured to generate the feedback signal;
    wherein the filtered signal is received at the input of the quantizer circuit and wherein the anti-windup circuit comprises:
       a clamping circuit having maximum positive/negative clamp limits less than or equal to positive/negative limits of the input signal range of the quantizer circuit, said anti-windup circuit having an input configured to receive the filtered signal and an output configured to generate a clamped filtered signal; and
       a further summation circuit configured to generate the dead-zone signal from a difference between the filtered signal and the clamped filtered signal.

17. The delta-sigma modulator of claim 16, wherein the quantizer circuit comprises:
    an analog-to-digital converter configured to receive the clamped filtered signal and generate an intermediate signal; and
    a digital-to-analog converter configured to convert the intermediate signal to generate the quantizer output signal.

18. The delta-sigma modulator of claim 16, wherein the loop filter circuit comprises a cascade of integrators and a summation circuit for each integrator, the summation circuit including an input configured to receive the input signal, a further input configured to receive the feedback signal, and an output coupled to an input of the integrator, said cascade of integrators including one or more of feed forward circuitry and feed back circuitry.

19. The delta-sigma modulator of claim 16, wherein the quantizer circuit comprises a digital pulse width modulation (PWM) quantizer.

* * * * *